United States Patent
Yamaguchi et al.

(10) Patent No.: US 7,476,839 B2
(45) Date of Patent: *Jan. 13, 2009

(54) AMPLIFIER CIRCUIT FOR OPTICAL DISK DRIVE

(75) Inventors: Hiroshi Yamaguchi, Osaka (JP); Masaki Taniguchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 758 days.

This patent is subject to a terminal disclaimer.

(21) Appl. No.: 10/983,737

(22) Filed: Nov. 9, 2004

(65) Prior Publication Data

US 2005/0063270 A1    Mar. 24, 2005

Related U.S. Application Data

(63) Continuation of application No. 10/183,367, filed on Jun. 28, 2002, now Pat. No. 6,818,879.

(30) Foreign Application Priority Data

Jul. 5, 2001    (JP)    ............................. 2001-204573

(51) Int. Cl.
  *H03F 3/06* (2006.01)
  *H03F 3/45* (2006.01)
  *H03G 3/00* (2006.01)
  *G11B 11/00* (2006.01)

(52) U.S. Cl. .................. 250/214 A; 327/103; 330/282; 369/13.01

(58) Field of Classification Search ............. 250/214 A, 250/208.1–208.6, 201.1–201.9, 214.1, 214 R; 330/278, 282, 285; 369/13.01, 13.34, 15, 369/44.25, 44, 27, 53, 43
See application file for complete search history.

(56) References Cited

U.S. PATENT DOCUMENTS

| | | | |
|---|---|---|---|
| 5,247,501 A * | 9/1993 | Hashimoto et al. ....... 369/44.11 |
| 5,379,439 A | 1/1995 | Harrison et al. | |
| 5,483,200 A | 1/1996 | Okabayashi et al. | |
| 5,831,952 A | 11/1998 | Yamada et al. | |
| 6,114,686 A | 9/2000 | Funahashi | |
| 6,262,957 B1 | 7/2001 | Inoue et al. | |
| 6,480,042 B2 * | 11/2002 | Kadowaki ................... 327/103 |
| 6,744,721 B2 | 6/2004 | Kamioka et al. | |
| 6,818,879 B2 * | 11/2004 | Yamaguchi et al. ..... 250/214 A |

FOREIGN PATENT DOCUMENTS

| | | |
|---|---|---|
| JP | 10-340526 | 12/1998 |
| JP | 2000-293933 | 10/2000 |

* cited by examiner

*Primary Examiner*—Stephen Yam
*Assistant Examiner*—Jennifer Bennett
(74) *Attorney, Agent, or Firm*—McDermott Will & Emery LLP

(57) ABSTRACT

An operational amplifier including a pair of differential input transistors is provided with a feedback resistor switching circuit and a variable current source. When a loaded optical disk is a DVD-ROM, the feedback resistor switching circuit reduces a gain of the operational amplifier and the variable current source selects a large current (of, for example, 1 mA) as a common bias current supplied to the differential input transistors. When the loaded optical disk is a DVD-RAM with low reflectance and low recording/reproducing speed, the feedback resistor switching circuit enhances the gain of the operational amplifier and the variable current source selects a small current (of, for example, 0.5 mA) as the common bias current.

7 Claims, 3 Drawing Sheets

AMPLIFIER CIRCUIT FOR OPTICAL DISK DRIVE

This non-provisional application is a continuation of International Application No. 10/183,367 now U.S. Pat. no. 6,818,879, which was filed on Jun. 28, 2002, and which claims priority to Japanese Patent Application No. JP 2001-204573, which was filed in Japan on Jul. 5, 2001 and which are all herein incorporated by reference.

BACKGROUND OF THE INVENTION

The present invention relates to an amplifier circuit, for use in an optical disk drive, for converting a photoelectric current into a voltage.

Today, a variety of media types of optical disks, such as CDs (compact disks) and DVDs (digital versatile disks), have been practically used. The CDs can be roughly classified into read only disks and writable disks. The read only disks include CD-DAs for digital audio, CD-ROMs mainly used for recording computer data and the like. The writable disks include CD-Rs that are once writable, CD-RWs that are writable and erasable and the like. The DVDs can be also roughly classified into read only disks and writable disks. The read only DVDs include DVD-ROMs and the like, and the writable DVDs include DVD-Rs that are once writable, DVD-RAMs that are writable and erasable and the like. In consideration of such a situation, a recent optical disk drive has become applicable to a plurality of media types.

In general, an optical disk drive irradiates an optical disk loaded therein with a laser beam so as to reproduce data by detecting reflected light. For example, an infrared laser beam is used for a CD and a red laser beam is used for a DVD. A light receiving unit of the optical disk drive includes a photodiode for generating a photoelectric current in accordance with the reflected light from the optical disk, and the photoelectric current is converted into a voltage by an amplifier circuit (i.e., a current-voltage conversion circuit).

Japanese Laid-Open Patent Publication No. 10-340526 discloses a technique to discriminate a media type of an optical disk by detecting reflectance of the optical disk on the basis of a peak level of a focus error signal. This publication further discloses an optical disk drive that selects any of a plurality of amplifier circuits having different gains or controls a power of the laser beam in accordance with the discriminated media type. Specifically, for example, when a CD-DA/ROM and a CD-RW are compared with each other, the reflectance of the CD-RW is as low as approximately ¼ of that of the CD-DA/ROM due to their difference in recording principle. Accordingly, in reproducing data from a CD-RW, an amplifier circuit with a large gain is selected or the power of the laser beam is increased, so that an output voltage level can be constant regardless of media type.

Japanese Laid-Open Patent Publication No. 2000-293933 discloses an optical disk drive that can control a gain of a single amplifier circuit on the basis of a discriminated media type. Specifically, for a DVD-RAM with low reflectance, a power of the laser beam is increased as compared with that for a DVD-ROM and a resistor with a large resistance value is selected as a feedback resistor of an operational amplifier included in the amplifier circuit, so that the gain of the amplifier circuit can be enhanced. Thus, an output level of the amplifier circuit can be constant regardless of media type.

On the other hand, a reproducing speed for DVD-ROMs is increasing. For example, for attaining 16× reproducing speed as compared with standard one, an amplifier circuit is required to have a frequency band as wide as 72 MHz (1 dB down) for DVD-ROMs. A recording/reproducing speed for DVD-RAMs is not demanded to be as high as the reproducing speed for DVD-ROMs, but there is a strong demand for lowering noise in recording/reproducing of DVD-RAMs.

However, a large bias current is conventionally supplied commonly to a pair of differential input transistors of an operational amplifier included in an amplifier circuit for converting a photoelectric current into a voltage, so as to uniformly attain a wide band characteristic regardless of media type. Accordingly, shot noise is caused in each of the pair of differential input transistors to the same extent in loading a DVD-ROM as in loading a DVD-RAM. Moreover, since a gain of the amplifier circuit is enhanced in loading a DVD-RAM, an output noise is increased. Also, this means that power is wastefully consumed in loading a DVD-RAM.

SUMMARY OF THE INVENTION

An object of the present invention is reducing noise and power consumption when an optical disk that does not need an amplifier circuit with a wide frequency band is loaded in an optical disk drive.

In order to achieve the object, the amplifier circuit of this invention, for use in an optical disk drive capable of coping with optical disks of a plurality of media types, is an amplifier circuit for converting, into a voltage, a photoelectric current generated by a photodiode in accordance with reflected light from a loaded optical disk, and includes an operational amplifier including a pair of differential input transistors; and a variable current source for selecting, in accordance with a discriminated media type of the loaded optical disk, a large current when the loaded optical disk needs a wide frequency band (namely, when the optical disk is a read only disk such as a DVD-ROM or a CD-DA/ROM) and a small current when the loaded optical disk does not need a wide frequency band (namely, when the optical disk is a writable disk such as a DVD-R/RAM or a CD-R/RW), as a common bias current supplied to the pair of differential input transistors.

According to the invention, the common bias current supplied to the pair of differential input transistors of the amplifier circuit is changed in accordance with the media type of the loaded optical disk. Therefore, noise and power consumption can be reduced when the amplifier circuit works as an amplifier circuit for, for example, a DVD-RAM recording/reproducing apparatus while keeping a frequency characteristic necessary as an amplifier circuit for a DVD-ROM reproducing apparatus.

DETAILED DESCRIPTION OF THE INVENTION

Now, a preferred embodiment of the invention will be described in detail with reference to the accompanying drawings.

Figure 1:
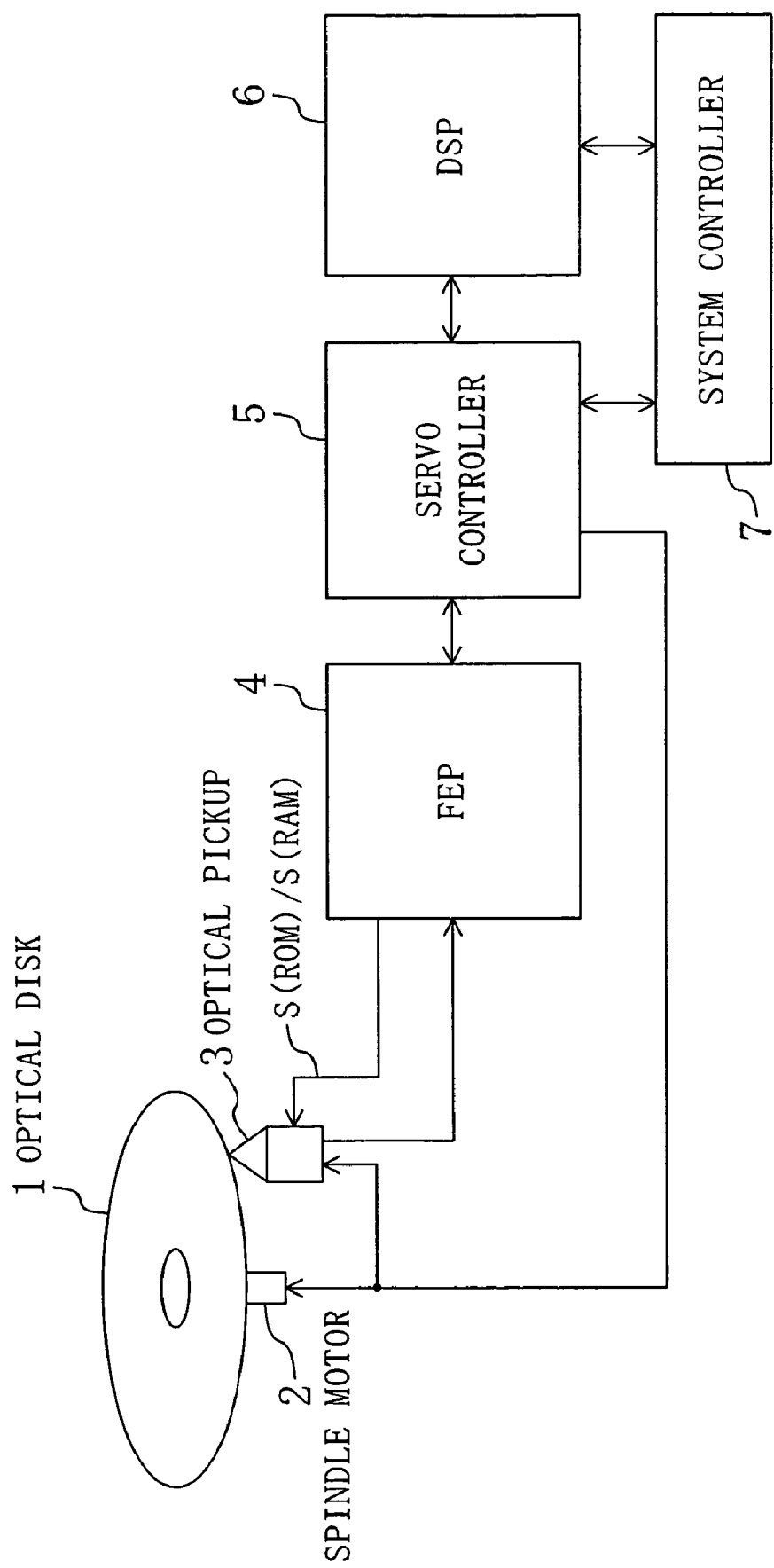
FIG. 1 is a block diagram for showing an exemplified structure of an optical disk drive using an amplifier circuit according to the invention.

FIG. 1 shows an exemplified structure of an optical disk drive using an amplifier circuit according to this invention. This optical disk drive can be operated as a high speed DVD-ROM reproducing apparatus and a low speed DVD-RAM recording/reproducing apparatus. In FIG. 1, a reference numeral 1 denotes an optical disk (a DVD-ROM or a DVD-RAM) loaded in the optical disk drive, a reference numeral 2 denotes a spindle motor, a reference numeral 3 denotes an optical pickup, a reference numeral 4 denotes a front end processor (FEP), a reference numeral 5 denotes a servo controller, a reference numeral 6 denotes a digital signal processor (DSP) and a reference numeral 7 denotes a system controller. The optical pickup 3 irradiates the optical disk 1 with a laser beam and detects reflected light from the optical disk 1. The FEP 4 processes an output from the optical pickup 3 through an analog operation, filtering and the like, and supplies disk discrimination signals S(ROM) and S(RAM), corresponding to the media type of the optical disk 1, to the optical pickup 3. It is herein assumed that the media type is discriminated on the basis of, for example, the level of the reflected light from the optical disk 1, so that the signals S(ROM) and S(RAM) can be respectively "H" and "L" when the optical disk 1 is a DVD-ROM and the signals S(ROM) and S(RAM) can be respectively "L" and "H" when the optical disk 1 is a DVD-RAM. The servo controller 5 performs, in addition to a servo control of the spindle motor 2, a focus servo control, a tracking servo control and a laser power control of the optical pickup 3. The DSP 6 performs digital signal processing such as error correction and signal reproducing processing. The system controller 7 controls the entire operation of the optical disk drive.

Figure 2:
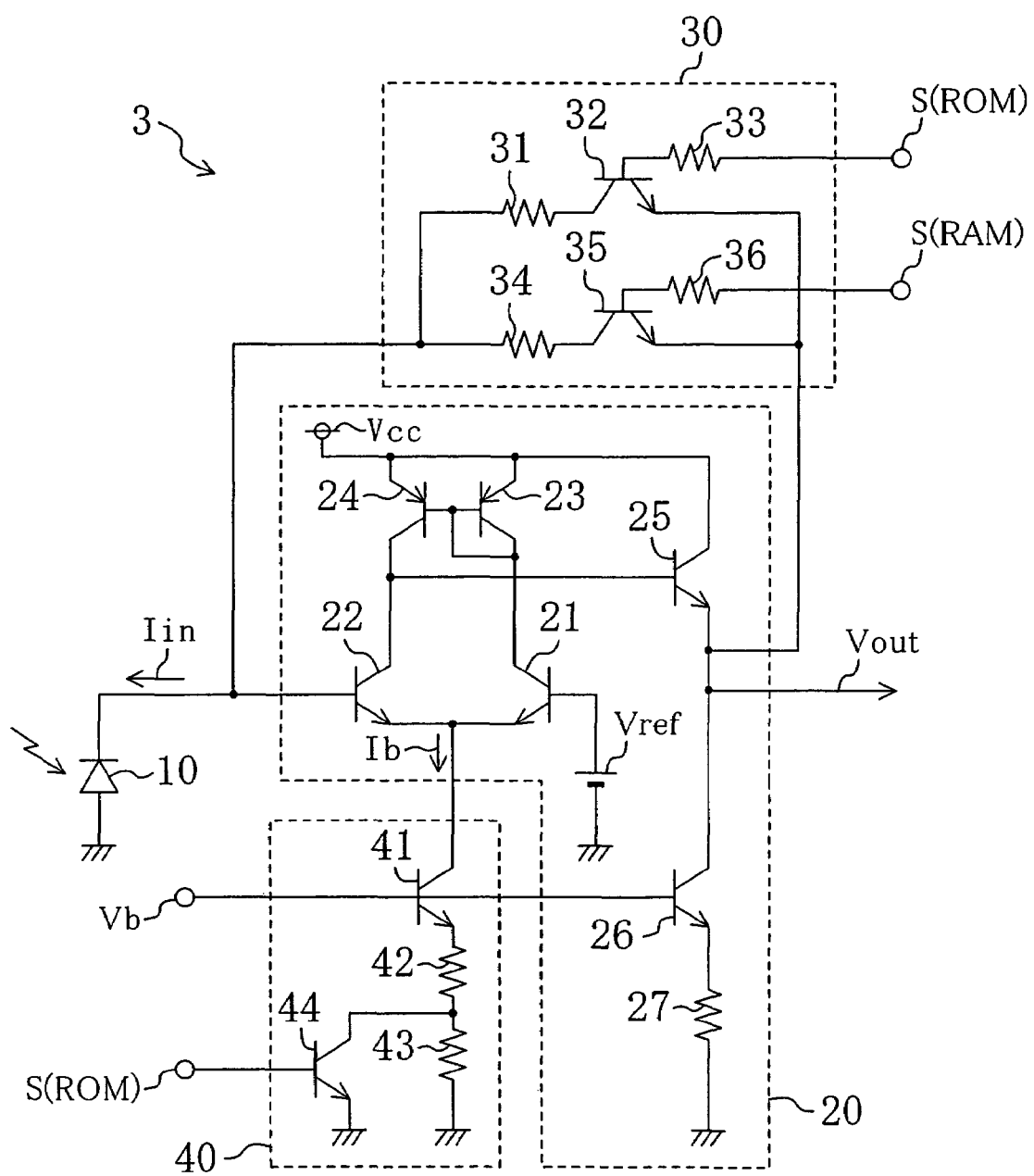
FIG. 2 is a circuit diagram for showing, together with a photodiode, an exemplified configuration of the amplifier circuit of this invention included in an optical pickup of FIG. 1.

FIG. 2 shows, together with a photodiode 10, an exemplified configuration of the amplifier circuit of this invention included in the optical pickup 3 of FIG. 1. This amplifier circuit, which converts a photoelectric current Iin generated by the photodiode 10 into a voltage Vout, includes an operational amplifier 20, a feedback resistor switching circuit 30 and a variable current source 40, and forms, together with the photodiode 10, one opto-electric conversion IC, that is, the so-called OEIC.

In the operational amplifier 20 functioning as a trans-impedance amplifier receiving the current Iin and outputting the voltage Vout, reference numerals 21, 22, 25 and 26 respectively denote first through fourth NPN transistors, reference numerals 23 and 24 respectively denote first and second PNP transistors, a reference numeral 27 denotes a first resistor, Vcc denotes a supply voltage (of, for example, 5V), Vref denotes a reference voltage (of, for example, 2.2V), Vb denotes a bias voltage and Ib denotes a bias current. The first and second NPN transistors 21 and 22 commonly receive, from the variable current source 40, the bias current Ib at their emitters, so as to together work as a pair of differential input transistors. A base of the first NPN transistor 21 is connected to the reference voltage Vref and a base of the second NPN transistor 22 is connected to a cathode of the photodiode 10. The third NPN transistor 25 functions as an emitter follower for outputting the voltage Vout.

The feedback resistor switching circuit 30 is disposed between an emitter of the third NPN transistor 25 and the base of the second NPN transistor 22. In the feedback resistor switching circuit 30, reference numerals 31, 33, 34 and 36 respectively denote second through fifth resistors and reference numerals 32 and 35 respectively denote fifth and sixth NPN transistors. It is herein assumed that the second and fourth resistors 31 and 34 respectively have resistance values of 5 kΩ and 20 kΩ. In the case where a DVD-ROM is loaded as the optical disk 1, the signal S(ROM) is "H" and hence the fifth NPN transistor 32 is turned on, resulting in selecting the second resistor 31 with a resistance value of 5 kΩ as a feedback resistor of the operational amplifier 20. On the other hand, in the case where a DVD-RAM is loaded as the optical disk 1, the signal S(RAM) is "H" and hence the sixth NPN transistor 34 is turned on, resulting in selecting the fourth resistor 34 with a resistance value of 20 kΩ as the feedback resistor of the operational amplifier 20. Therefore, a gain of the amplifier circuit obtained in loading a DVD-RAM is four times as large as that obtained in loading a DVD-ROM.

In the variable current source 40 for supplying the bias current Ib, reference numerals 41 and 44 respectively denote seventh and eighth NPN transistors and reference numerals 42 and 43 respectively denote sixth and seventh resistors. It is herein assumed that the bias voltage Vb is 0.9V, that the base-emitter voltage of the seventh NPN transistor 41 is 0.7V, and that both the sixth and seventh resistors 42 and 43 have a resistance value of 200 Ω. In the case where a DVD-ROM is loaded as the optical disk 1, the eighth NPN transistor 44 is turned on because the signal S(ROM) is "H", and hence, the bias current Ib is $(0.9V-0.7V)/200\ \Omega = 1$ mA. On the other hand, in the case where a DVD-RAM is loaded as the optical disk 1, the eighth NPN transistor 44 is turned off because the signal S(ROM) is "L", and hence, the bias current Ib is $(0.9V-0.7V)/(200\ \Omega+200\ \Omega)=0.5$ mA.

Figure 3:
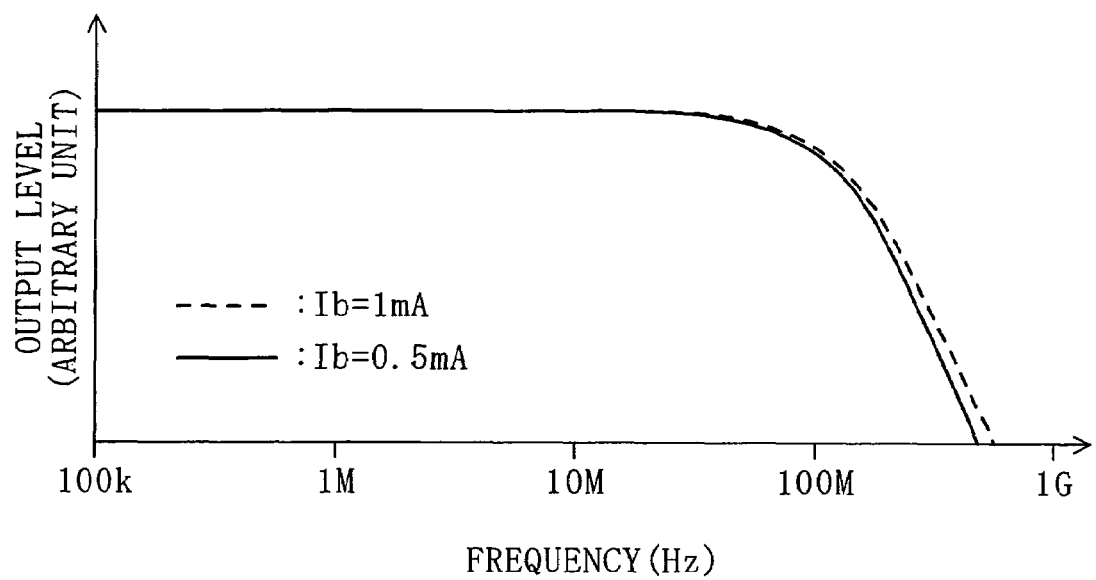
FIG. 3 is an output level-frequency characteristic diagram of the amplifier circuit of FIG. 2.
Figure 4:
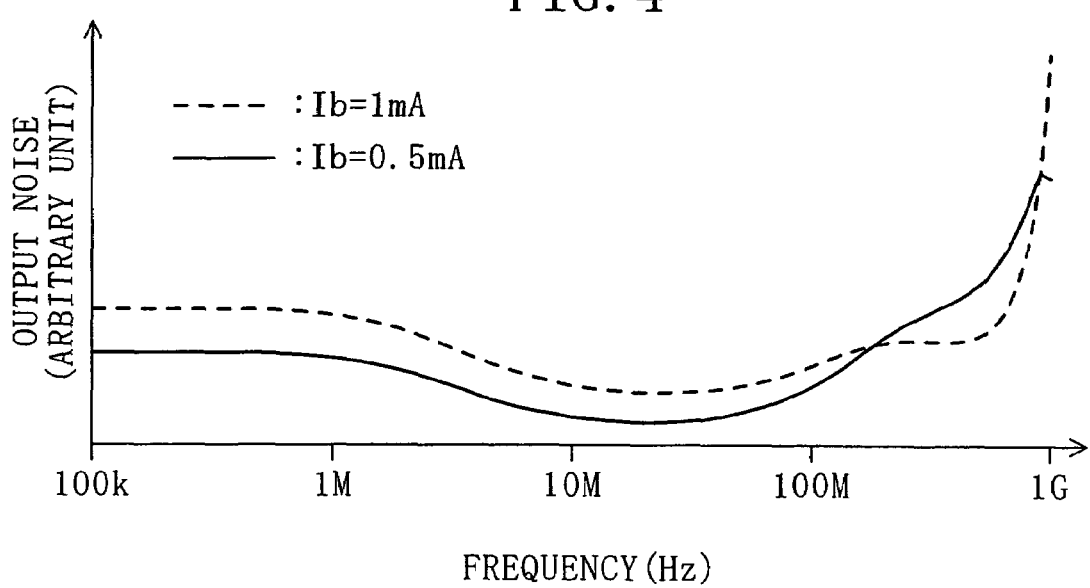
FIG. 4 is an output noise-frequency characteristic diagram of the amplifier circuit of FIG. 2.

Results of simulation carried out on the amplifier circuit of FIG. 2 are shown in FIGS. 3 and 4. FIG. 3 shows an example of an output level-frequency characteristic of the amplifier circuit, and FIG. 4 shows an example of an output noise-frequency characteristic of the amplifier circuit. According to FIG. 3, the output level in a high frequency region obtained when a DVD-RAM is loaded (namely, when the bias current Ib is 0.5 mA) is slightly lower than that obtained when a DVD-ROM is loaded (namely, when the bias current Ib is 1 mA). On the other hand, according to FIG. 4, the output noise in a frequency region below 200 MHz obtained when a DVD-RAM is loaded (namely, when the bias current Ib is 0.5 mA) is reduced. This is probably because shot noise caused in the bases of the pair of differential input transistors 21 and 22 included in the operational amplifier 20 is reduced.

In this manner, according to the amplifier circuit of FIG. 2, the bias current Ib supplied to the pair of differential input transistors included in the operational amplifier 20 is changed in accordance with the discriminated media type of the loaded optical disk 1, so that noise and power consumption can be reduced when the amplifier circuit works as an amplifier circuit for a DVD-RAM recording/reproducing apparatus while keeping a frequency characteristic necessary as an amplifier circuit for a DVD-ROM reproducing apparatus. In addition, the amplifier circuit of FIG. 2 can switch the feedback resistor and the bias current of the single operational amplifier 20, and hence, the chip area can be reduced as compared with the structure in which any of a plurality of amplifier circuits having different gains is selected. Accordingly, this amplifier circuit of FIG. 2 is suitably used in an OEIC.

The present invention is applicable to an arbitrary optical disk drive capable of coping with a variety of types of media including DVDs and CDs. The invention is also applicable to an optical disk of the next generation that is expected to realize high density recording by using a blue laser beam.

For example, in the case where the invention is applied to CDs, the aforementioned control for a DVD-ROM corresponds to control for a CD-ROM and the aforementioned control for a DVD-RAM corresponds to control for a CD-RW. The numbers of feedback resistors and bias currents to be switched in the operational amplifier 20 can be arbitrarily determined. In application to a DVD-RAM or a CD-RW, the feedback resistor and the bias current of the operational amplifier 20 may be switched between a recording operation and a reproducing operation. Furthermore, a power of laser beam may be controlled together.

Also, the media type of the optical disk 1 can be arbitrarily discriminated. For example, disk identification information previously recorded in an inner circumferential portion of the loaded optical disk 1 may be read so that, for example, the DSP 6 can supply the disk discrimination signal in accordance with this information. Needless to say, any of various discrimination methods described in Japanese Laid-Open Patent Publication Nos. 10-340526 and 2000-293933 may be employed.

What is claimed is:

1. An amplifier circuit, for use in an optical disk drive operating with optical disks of a plurality of media types, for converting, into a voltage, a photoelectric current generated by a photodiode based on light from a loaded optical disk, comprising:
   an operational amplifier including a pair of differential input transistors; and
   a variable current source for selecting a first current when said loaded optical disk is a first type optical disk which requires a first frequency band and a second current when said loaded optical disk is a second type optical disk which requires a second frequency band as a common bias current supplied to said pair of differential input transistors,
   wherein the second current is smaller than the first current; and,
   the second frequency band is narrower than the first frequency band,
   the amplifier circuit further comprising a feedback resistor switching circuit for selecting a first resistor having a first resistance value when said loaded optical disk is a first type optical disk which has a first reflectance and a second resistor having a second resistance value when said loaded optical disk is a second type optical disk which has a second reflectance value, as a feedback resistor of said operational amplifier,
   wherein the second resistance value is larger than the first resistance value; and,
   the second reflectance value is lower than the first reflectance value.

2. The amplifier circuit of claim 1, wherein said first type optical disk is a read only disk.

3. The amplifier circuit of claim 1, wherein said second type optical disk is a rewritable disk.

4. The amplifier circuit of claim 1, wherein said light from a loaded optical disk is light reflected by the loaded optical disk.

5. An amplifier circuit, for use in an optical disk drive operating with optical disks of a plurality of media types, for converting, into a voltage, a photoelectric current generated by a photodiode based on light from a loaded optical disk, comprising:
   an operational amplifier including a pair of differential input transistors; and
   a variable current source for selecting a first current when said loaded optical disk is a read only disk and a second current when said loaded optical disk is a rewritable disk, as a common bias current supplied to said pair of differential input transistors,
   wherein the second current is smaller than the first current,
   the amplifier circuit further comprising a feedback resistor switching circuit for selecting, in accordance with the discriminated media type of said loaded optical disk, a first resistor having a first resistance value when said loaded optical disk is a read only disk and a second resistor having a second resistance value when said loaded optical disk is a rewritable disk, as a feedback resistor of said operational amplifier,
   wherein the second resistance value is larger than the first resistance.

6. The amplifier circuit of claim 1, further comprising:
   a first feedback path from an output of said operational amplifier through said first resistor to an input of said operational amplifier; and
   a second feedback path from said output of said operational amplifier through said second resistor to said input of said operational amplifier.

7. The amplifier circuit of claim 5, further comprising:
   a first feedback path from an output of said operational amplifier through said first resistor to an input of said operational amplifier; and
   a second feedback path from said output of said operational amplifier through said second resistor to said input of said operational amplifier.

* * * * *